United States Patent
Ryan (10) Patent No.: US 9,349,631 B2
(45) Date of Patent: May 24, 2016

(54) METHOD FOR DEFINING AN ISOLATION REGION(S) OF A SEMICONDUCTOR STRUCTURE

(71) Applicant: GLOBALFOUNDRIES Inc., Grand Cayman (KY)

(72) Inventor: Errol Todd Ryan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/504,479

(22) Filed: Oct. 2, 2014

(65) Prior Publication Data

US 2016/0099168 A1  Apr. 7, 2016

(51) Int. Cl.
- *H01L 21/76* (2006.01)
- *H01L 21/762* (2006.01)
- *H01L 21/265* (2006.01)
- *H01L 21/02* (2006.01)

(52) U.S. Cl.
CPC .... *H01L 21/76224* (2013.01); *H01L 21/02337* (2013.01); *H01L 21/26566* (2013.01)

(58) Field of Classification Search
None
See application file for complete search history.

(56) References Cited

U.S. PATENT DOCUMENTS

| | | | |
|---|---|---|---|
| 2003/0052384 A1* | 3/2003 | Sato et al. | 257/506 |
| 2003/0203652 A1* | 10/2003 | Bao | C23C 16/401 |
| | | | 438/783 |
| 2007/0117408 A1* | 5/2007 | Nguyen et al. | 438/780 |
| 2007/0222081 A1* | 9/2007 | Chen et al. | 257/773 |
| 2008/0237743 A1* | 10/2008 | Ramin et al. | 257/407 |
| 2009/0072401 A1* | 3/2009 | Arnold et al. | 257/751 |
| 2011/0184142 A1* | 7/2011 | Magee et al. | 528/29 |
| 2013/0199832 A1* | 8/2013 | Galster et al. | 174/260 |
| 2013/0210241 A1* | 8/2013 | LaVoie et al. | 438/791 |
| 2013/0249045 A1* | 9/2013 | Kang et al. | 257/499 |

* cited by examiner

*Primary Examiner* — Evren Seven
*Assistant Examiner* — Xiaoming Liu
(74) *Attorney, Agent, or Firm* — Heslin Rothenberg Farley & Mesiti P.C.

(57) ABSTRACT

Methods for defining an isolation region of a semiconductor structure are provided. The method includes, for instance: providing a semiconductor structure with a recess therein; disposing an insulator layer conformally within the recess in the semiconductor structure to partially fill the recess; modifying at least one material property of the insulator layer to obtain a densified insulator layer within the recess, where the modifying reduces a thickness of the densified insulator layer compared to that of the insulator layer; and depositing at least one additional insulator layer within the recess over the densified insulator layer, where the densified insulator layer within the recess defines, at least in part, an isolation region of the semiconductor structure.

23 Claims, 4 Drawing Sheets

METHOD FOR DEFINING AN ISOLATION REGION(S) OF A SEMICONDUCTOR STRUCTURE

BACKGROUND

Semiconductor devices such as integrated circuits, are typically fabricated in large batches from a semiconductor wafer. The semiconductor wafer is then diced into individual dies, or microchips, which are subsequently packaged. During integrated circuit fabrication, individual devices, such as transistors, may be electrically isolated from one another by fabricating isolation regions such as, for instance, deep trench isolation regions and shallow trench isolation regions. The continually increasing demand for smaller circuit structures and faster device performance is driven, at least in part, by performance enhancements in manufacturing processes including, for instance, fabricating isolation regions, by which the circuit structures are formed on a wafer.

BRIEF SUMMARY

The shortcomings of the prior art are overcome and additional advantages are provided through the provision, in one aspect, of a method which includes, for instance: providing a semiconductor structure with a recess therein; disposing an insulator layer conformally within the recess in the semiconductor structure to partially fill the recess; modifying at least one material property of the insulator layer to obtain a densified insulator layer within the recess, wherein the modifying reduces a thickness of the densified insulator layer compared to that of the insulator layer; and depositing at least one additional insulator layer within the recess over the densified insulator layer, wherein the densified insulator layer within the recess defines, at least in part, an isolation region of the semiconductor structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Disclosed herein, in part, is a method for defining an isolation region of a semiconductor structure having a densified insulator layer. In one aspect, semiconductor device fabrication, at an early stage of fabrication, typically involves the process of fabricating isolation regions to electrically isolate various integrated circuits, within a single chip or wafer area. By way of example, the isolation regions may include, for instance, shallow trench isolation (STI) region and deep trench isolation (DTI) region. For instance, the shallow trench isolation (STI) region may be formed where the electrical isolation is desired, by patterning or etching one or more recesses in a semiconductor substrate and subsequently, disposing an insulator layer within the recess(es). As the size of technology nodes transitions to 7 nanometers and below, significant challenges may continue to arise with the existing semiconductor fabrication processing techniques.

By way of example, the insulator layer disposed within the recess(es) in the semiconductor structure may include or be fabricated of a material such as, for instance, flowable oxide material or a high-aspect ratio process (HARP)-silicon oxide material which creates the electrical isolation between the desired integrated circuits. As a specific example, an oligo-azasilane precursor material (for instance, obtained from silicon, nitrogen and hydrogen (SixNyHz)-containing precursors such as, for example, trisilylamine (TSA) or disilylamine), disposed within the recess(es) in the semiconductor structure may be subjected, for instance, to one or more annealing processes to, at least in part, oxidize the oligo-azasilane material to form an oxide material such as, for instance, silicon oxide material. For instance, the annealing process may be performed in the presence of oxygen containing process gas, for instance, steam or water at a temperature of about 400° C. to 700° C. for a time period of about 30 min to 3 hrs to form the oxide material. This oxide material, upon subjecting to additional annealing processes, such as, for instance, thermal or dry annealing processes facilitates dissociating the oxide material to obtain a cross-linked oxide material such as, for instance, flowable oxide material and removing resultant by-product materials such as, for instance, silanol, water or nitrogen-containing by-product materials. One skilled in the art will know that the thermal or dry annealing processes may typically be performed in the absence of oxygen-containing process gases at a temperature of about 500° C. to 1200° C. for a time period of about 1 min to 2 hrs to obtain the cross-linked oxide material which defines the isolation region within the semiconductor structure. In one example, the forming of the cross-linked oxide material, such as flowable oxide material may be represented as:

One challenge with the above-described approach to defining the isolation region of the semiconductor structure is that the high-temperature annealing processes typically employed during the providing of the insulator layer could disadvantageously result in degrading the semiconductor material of the semiconductor structure. This, in turn, could impose undesirable limitations on the available semiconductor materials to be employed in a high-aspect ratio semiconductor fabrication processing. Additionally, the high-temperature annealing processes employed during the providing of the insulator layer could also result in significant tensile stress in the isolation region due to different coefficients of thermal expansion (CTE) of the isolation region and the device substrate (e.g., semiconductor material including silicon). The resultant stresses in the proximity of the isolation region disadvantageously could cause structural changes, for instance, bending of fin structure(s) of the resultant devices.

To overcome these issues, disclosed herein below, in one aspect, is an enhanced method for defining an isolation region of the semiconductor structure utilizing, for instance, a gas-cluster ion beam (GCIB) process with a reduced process temperature to obtain a densified insulator layer disposed therein. The method includes, for instance, providing a semiconductor structure with a recess; disposing an insulator layer conformally within the recess in the semiconductor structure to partially fill the recess; modifying at least one material property of the insulator layer to obtain a densified insulator layer within the recess, where the modifying reduces a thickness of the densified insulator layer compared to that of the insulator layer; and depositing at least one additional insulator layer within the recess over the densified insulator layer, wherein the densified insulator layer within the recess defines, at least in part, an isolation region of the semiconductor structure.

By way of example, modifying the at least one material property of the insulator layer may include bombarding the insulator layer with at least one species of gas clusters to modify the at least one material property thereof. For instance, the bombarding utilizes, in part, a gas-cluster ion beam process. In one example, the at least one species of gas clusters may be or include at least one of argon (Ar), water ($H_2O$) or argon and water (Ar+$H_2O$), carbon dioxide ($CO_2$), carbon monoxide (CO) or ozone ($O_3$) molecules.

In one embodiment, the disposing the insulator layer may include providing a monomeric precursor material conformally within the recess and the modifying may include bombarding the insulator layer to facilitate dissociating the monomeric precursor material to obtain the densified insulator layer and at least one by-product material, with the bombarding facilitating removing the at least one by-product material from the densified insulator layer. Note that, in this example, the at least one by-product material being removed from the densified insulator layer may be or include, for instance, silanol (Si—OH) and/or water ($H_2O$) molecules. In this example, the modifying may include bombarding the insulator layer with ion beam energy to provide a localized high-energy interaction within an upper surface of the insulator layer, where the high-energy interaction advantageously facilitates reducing the thickness of the insulator layer. Modifying may further include bombarding the insulator layer at an angle of incidence which is normal to the semiconductor structure to facilitate reducing thickness of the insulator layer in the direction of the angle of incidence. In one example, the monomeric precursor material being disposed within the recess may include or be fabricated of an oxysilane precursor material such as, for example, tetraethyl orthosilicate (TEOS), and the densified insulator layer may include or be fabricated of a cross-linked oxide material obtained, at least in part, from modifying the insulator layer having the oxysilane precursor material. Note that the cross-linked oxide material may include, for instance, a densified high-aspect ratio (HARP) oxide material having Si—O—Si linkage disposed therein.

In another embodiment, the disposing the insulator layer may include providing an oligomeric precursor material, and the modifying may include bombarding the insulator layer to convert the oligomeric precursor material to an oligomeric oxide material, with the bombarding dissociating the oligomeric oxide material to obtain the densified insulator layer and at least one by-product material. Note that, in this example, the bombarding the insulator layer further facilitates removing the at least one by-product material disposed therein, in which the at least one by-product material may be or include, for instance, silanol (Si—OH) having one or more hydroxyl groups disposed therein and/or water ($H_2O$) molecules. In another example, the modifying may further include annealing the insulator layer having, for instance, oligomeric precursor material to facilitate oxidizing, at least in part, the insulator layer to form an oligomeric oxide (Si—O—Si) material and at least one by-product material. In this example, the bombarding preferentially removes the at least one by-product material such as, for example, silanol (Si—

OH), water ($H_2O$) and/or other organic by-product materials such as, ethanol ($C_2H_5OH$) molecules. In this embodiment, the oligomeric precursor material may include or be fabricated of an oligo-azasilane precursor material having at least one of silicon-oxygen (Si—O) and/or silicon-nitrogen (Si—N) groups disposed therein, and the densified insulator layer may include or be fabricated of a cross-linked oxide material such as, for instance, densified flowable oxide material obtained, at least in part, from modifying the insulator layer having the oligo-azasilane precursor material.

In one aspect, the modifying includes bombarding the insulator layer with at least one species of gas clusters to facilitate reducing a tensile stress of the densified insulator layer. In one specific example, the densified insulator layer may include or be fabricated of a first material layer such as, for example, cross-linked oxide material (for instance, densified flowable oxide material), and the additional insulator layer may include or be fabricated of a second material layer such as, for example, high-density plasma (HDP) oxide material. Note that the first material layer and the second material layer are different material layers.

In another aspect, the at least one additional insulator layer may include a first additional insulator layer and a second insulator layer. By way of example, the method may further include modifying at least one material property of the first additional insulator layer to obtain a densified first additional insulator layer and modifying at least one material property of the second insulator layer to obtain a densified second additional insulator layer, and the densified second additional insulator layer being disposed over the densified first additional insulator layer. For instance, the densified insulator layer may include or be fabricated of a cross-linked oxide layer, and the densified first additional insulator layer may include or be fabricated of a first cross-linked oxide layer, and the densified second additional insulator layer may include or be fabricated of a second cross-linked oxide layer. Note that, in one specific example, the cross-linked oxide layer, the first cross-linked oxide layer and the second cross-linked oxide layer may be or include a same material such as, for example, densified flowable oxide material. In another example, the cross-linked oxide layer, the first cross-linked oxide layer and the second cross-linked oxide layer may be or include a same material such as, for instance, a densified high-aspect ratio oxide material.

Reference is made below to the drawings, which are not drawn to scale for ease of understanding, wherein the same reference numbers used throughout different figures designate the same or similar components.

By way of example, FIGS. 1A-1I depict an example of an enhanced method for defining an isolation region of the semiconductor structure. Advantageously, as described below, the isolation region having a densified insulator layer is attained using, for instance, a gas-cluster ion beam (GCIB) process, in accordance with one or more aspects of the present invention.

Figure 1A:
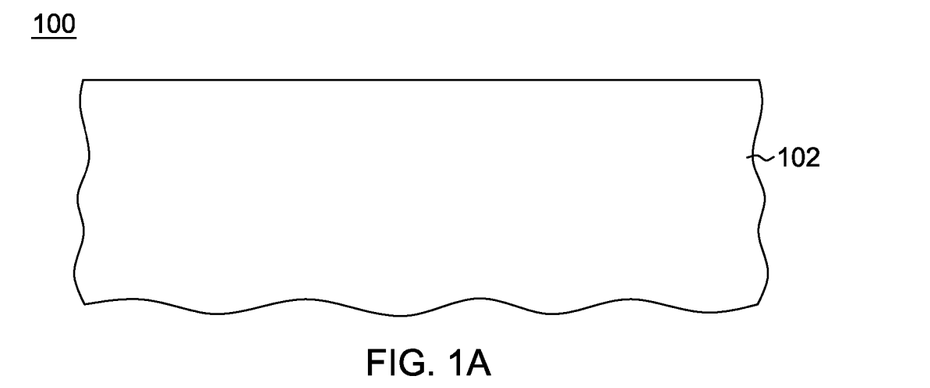
FIG. 1A is a cross-sectional elevational view of a structure obtained during one embodiment of a semiconductor structure fabrication process, in accordance with one or more aspects of the present invention.

FIG. 1A is a cross-sectional elevational view of one embodiment of a structure 100, attained during an early stage of semiconductor fabrication processing, in accordance with one or more aspects of the present invention. In one example, structure 100 may be or include a wafer, from which numerous microchips may be fabricated.

Structure 100 may include a substrate 102, such as a bulk semiconductor material, for example, a bulk silicon wafer. In one example, substrate 102 may be or include any silicon-containing substrate including, but not limited to, silicon (Si), single crystal silicon, polycrystalline Si, amorphous Si, silicon-on-nothing (SON), silicon-on-insulator (SOI), or silicon-on-replacement (SRI) substrates and the like. Substrate 102 may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof. Although not depicted in the figures, one or more layers may optionally be disposed over substrate 102 to facilitate patterning and etching to form one or more recesses within substrate 102, and may be used, for example, to protect the substrate during subsequent processing.

Figure 1B:
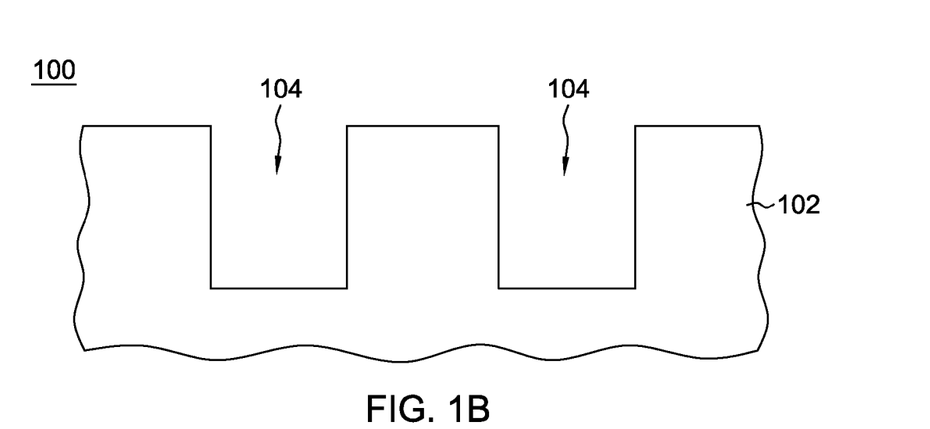
FIG. 1B depicts the structure of FIG. 1A after forming one or more recesses within the substrate, in accordance with one or more aspects of the present invention.

FIG. 1B illustrates the structure of FIG. 1A after forming one or more recesses 104 within substrate 102. At the stage of fabrication depicted in FIG. 1B, recess(es) 104 may be formed by any of a variety of conventional fabrication process, which may include one or more steps of patterning and removal of material. In one example, substrate 102 may be patterned using various approaches, including direct lithography, sidewall image transfer techniques, extreme ultraviolet lithography (EUV), e-beam techniques, litho-etch litho-etch technique, or litho-etch litho-freeze technique. Following patterning, material of substrate 102 may be removed to form recess(es) 104 using any suitable removal process, such as, an etching process. In one example, etching may be an anisotropic etching, such as reactive ion etching (RIE), using an appropriate chemistry, depending on the material of the layers being etched. In a specific example, the reactive ion etching may be performed using fluorine-based chemistry and gases such as tetrafluoromethane ($CF_4$), trifluoromethane ($CHF_3$), difluoromethane ($CH_2F_2$), fluoromethane ($CH_3F$), octofluoromethane ($C_4F_8$), hexafluoro-1,3-butadiene ($C_4F_6$), sulfur hexafluoride ($SF_6$) and oxygen ($O_2$).

Figure 1C:
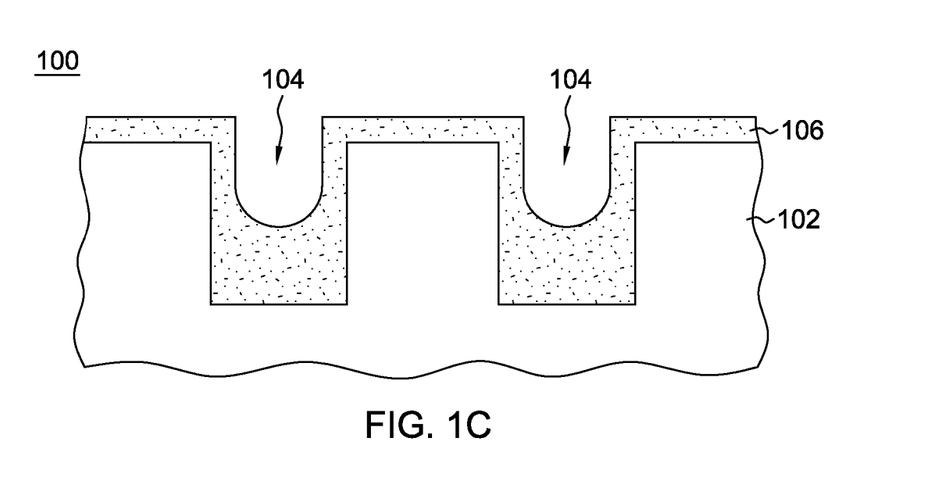
FIG. 1C depicts the structure of FIG. 1B, with an insulator layer having been disposed to partially fill the recess(es), in accordance with one or more aspects of the present invention.

FIG. 1C illustrates the structure of FIG. 1B, with insulator layer 106 having been conformally disposed to partially fill recess(es) 104. By way of example, in one embodiment, the insulator layer may include or be fabricated of a monomeric precursor material and may be deposited using any conventional deposition process, such as, chemical vapor deposition (CVD) process. In one example, the monomeric precursor material may be or include an oxysilane precursor material such as, for instance, tetraethoxysilane (TEOS), triethoxysilane (TRIES), tetramethoxysilane (TMOS) or trimethoxysilane (TRIMOS). In another example, the monomeric precursor material may also be or include a siloxane precursor material such as, for instance, hexamethoxydisiloxane (HMODS) or octamethoxytrisiloxane (OMOTS). In yet another embodiment, the insulator layer may include or be fabricated of an oligomeric precursor material, for instance, an oligo-azasilane precursor material having at least one of silicon-oxygen (Si—O) and/or silicon-nitrogen (Si—N) functional groups disposed therein. In one example, the oligo-azasilane precursor may be obtained from silicon, nitrogen and hydrogen ($Si_xN_yH_z$)-containing precursors such as, for example, trisilylamine (TSA) or disilylamine. Note that, in one embodiment, the height of the insulator layer being disposed partially within recess (es) 104 may be dependent upon the process parameters and the technology nodes being employed.

Figure 1D:
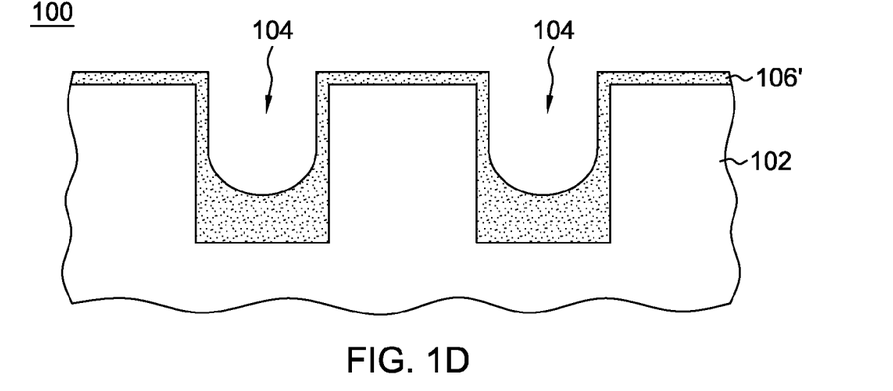
FIG. 1D depicts the structure of FIG. 1C after bombarding the insulator layer with one or more species of gas-clusters to, for instance, obtain a densified insulator layer, in accordance with one or more aspects of the present invention.

FIG. 1D illustrates the structure of FIG. 1C after bombarding insulator layer 106 (FIG. 1C) with one or more species of gas-clusters to facilitate modifying at least one material property of the insulator layer. In this embodiment, the bombarding of insulator layer 106 (FIG. 1C) with one or more species of gas clusters may be accomplished utilizing, in part, a gas-cluster ion beam (GCIB) process. By way of example, the gas cluster species may include or be fabricated of an oxidizing gas molecules such as, for example, argon (Ar), water ($H_2O$), oxygen ($O_2$), argon and water ($Ar+H_2O$), carbon dioxide ($CO_2$), ozone ($O_3$), carbon monoxide (CO) molecules.

In one example, the bombarding of the monomeric precursor material, for instance, an oxysilane precursor material such as, for example, tetraethoxysilane (TEOS) in the presence of oxygen-containing process gas, for instance, ozone, advantageously facilitates oxidizing the tetraethoxysilane precursor material to form an in-situ oxide film. This in-situ oxide film, in turn, dissociates to obtain a cross-linked oxide material and one or more by-product materials, resulting in densified insulator layer 106' within the recess(es). In this example, the cross-linked oxide material may be or include, for instance, a densified high-aspect ratio (HARP) oxide material and the by-product material(s) may be or include volatile materials, for instance, silanol (Si—OH), water ($H_2O$) and/or other organic by-product materials such as, ethanol ($C_2H_5OH$) molecules. Additionally, the high-energy bombarding of the insulator layer also facilitates removing the by-product material(s) from the densified insulator layer.

In another example, the bombarding of the oligomeric precursor material, for instance, an oligo-azasilane precursor material (having, for instance, at least one of silicon-oxygen (Si—O) and/or silicon-nitrogen (Si—N) functional groups disposed therein) in the presence of oxidizing gas molecules, for example, argon and water ($Ar+H_2O$), advantageously facilitates converting the oligo-azasilane precursor to an oligomeric oxide material. Additionally, the high-energy bombarding of the insulator layer also facilitates dissociating the oligomeric oxide material to obtain a cross-linked oxide material and one or more by-product material(s), resulting in densified insulator layer 106' within the recess(es). The high-energy bombarding of the insulator layer also facilitates removing the by-product material(s) from the densified insulator layer. In this example, the cross-linked oxide material may be or include, for instance, a densified flowable oxide material, and the by-product material(s) being removed from the densified insulator layer may be or include volatile materials such as, for instance, silanol (Si—OH), water ($H_2O$) and/or other organic by-product materials such as, ethanol ($C_2H_5OH$) molecules.

In addition or an alternate embodiment, the oligomeric precursor material having, for instance, an oligo-azasilane precursor material may be subjected to one or more annealing processes to facilitate converting the oligo-azasilane precursor material to the oligomeric oxide material. The one or more annealing processes may be performed using, for instance, rapid thermal anneal or steam anneal. In one example, the annealing process may be performed using steam annealing process at a temperature of about 400° C. to 600° C. in the presence of oxidizing process gases such as, water. The oligomeric oxide material may subsequently be bombarded with gas-cluster(s) species via, for instance, a gas-cluster ion beam (GCIB) process to facilitate dissociating the oligomeric oxide material to obtain the cross-linked oxide material and one or more by-product material(s), resulting in the densified insulator layer, as described above.

Note that, in one embodiment, the bombarding of the insulator layer with gas-cluster(s) species via, for instance, a gas-cluster ion beam (GCIB) process may be accomplished by controlling process parameters such as, for instance, species of gas clusters chosen, the energy of the cluster beam, the material of the insulator layer, and the angle at which gas-cluster(s) are bombarded, so as to facilitate modifying at least one material property of the insulator layer. For instance, the bombarding of the insulator layer may advantageously facilitate forming densified insulator layer 106', as well as reducing a thickness of the densified insulator layer compared to that of insulator layer 106 (FIG. 1C). In one example, the thickness of the densified insulator layer may be reduced within a range of about 10 to 50 percent of the thickness of the insulator layer.

As known, during a gas-cluster ion beam (GCIB) process, an upper surface of the insulator layer may be bombarded by a beam of high-energy nano-scale gas-cluster(s) species such as, for instance, oxygen ($O_2$) or water ($H_2O$). By way of example, the gas-cluster(s) species formed, for instance, by condensation of individual gas atoms (or molecules) during an adiabatic expansion of high pressure gas into vacuum, may typically be accelerated at high velocities to be focused into a high-energy ion beam which upon bombardment, provides a localized high-energy interaction within an upper surface of the insulator layer. For instance, upon impact, the high-energy of the gas-cluster ion beam is converted into heat energy producing, for instance, high temperatures on a pico-second time scale, facilitating a variety of surface modification processes such as, for example, densifying the insulator layer, and reducing a thickness of the densified insulator layer. In one example, the insulator layer may be bombarded with the gas-cluster(s) to a depth of about 2 to 20 nm, depending on the process parameters employed, thereby controlling the thickness of the densified insulator layer. Note that, this localized high-energy interaction of the gas-cluster ion beam (GCIB) process advantageously facilitates making this process suitable for use with semiconductor materials such as, for example, indium phosphide (InP), indium arsenide (InAs), and/or indium antimonide (InSb) and other Group IV-VI materials of the periodic table. Further, the insulator layer may be bombarded with the gas-cluster(s) at an angle of incidence which is normal to the semiconductor structure so as to facilitate reducing the thickness of the insulator layer in the direction of the angle of incidence. Additionally, the localized high-energy interaction caused due to the bombarding of the insulator layer with the gas-cluster(s) may be controlled so as to affect desired changes to an upper surface of the densified insulator layer, without causing a sub-surface damage to the densified insulator layer. This, for instance, advantageously results in reducing tensile stress of densified insulator layer which, in turn, facilitates reducing or minimizing structural changes of the resultant device(s).

Figure 1E:
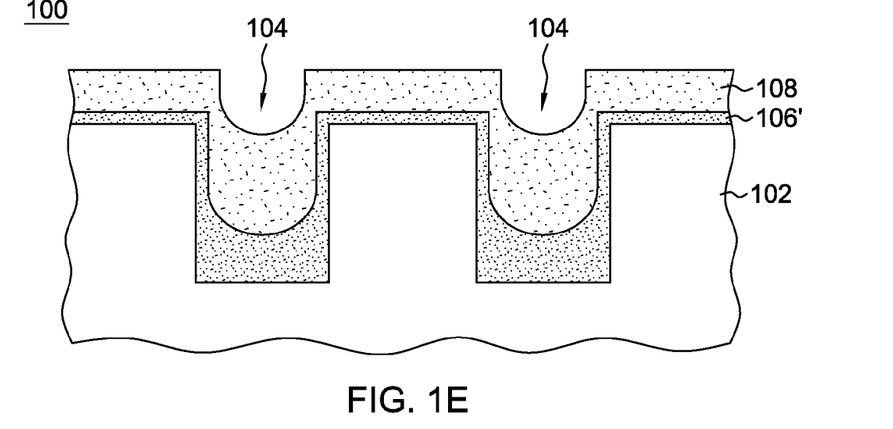
FIG. 1E depicts the structure of FIG. 1D with a first additional insulator layer disposed over the densified insulator layer, in accordance with one or more aspects of the present invention.
Figure 1F:
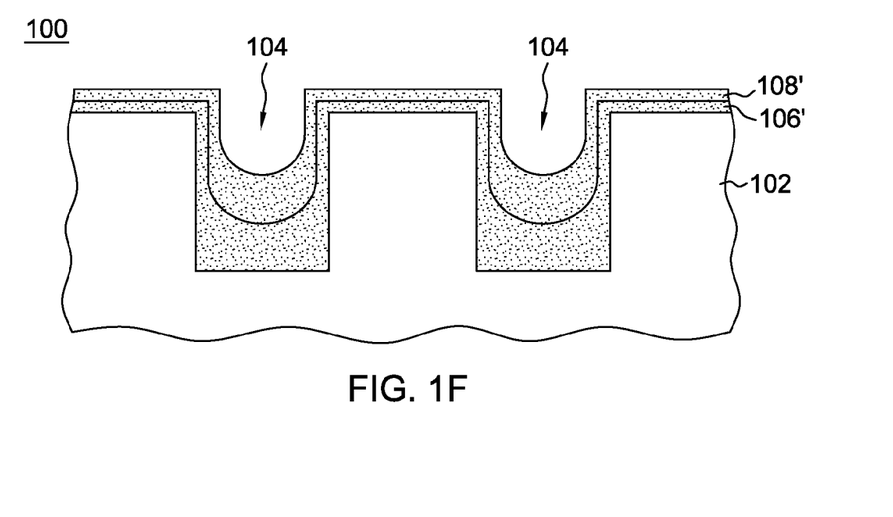
FIG. 1F depicts the structure of FIG. 1E after bombarding the first additional insulator layer with one or more species of gas-clusters to, for instance, obtain a densified first additional insulator layer, in accordance with one or more aspects of the present invention.

FIG. 1E illustrates the structure of FIG. 1D with a first additional insulator layer 108 disposed over densified insulator layer 106'. The material of first additional insulator layer 108 may be similar or identical to the material of insulator layer 106 and may be formed using any of the deposition processes described for providing insulator layer 106, with respect to FIG. 1C. Briefly, the first additional insulator layer may include or be fabricated of a monomeric precursor material such as, for instance, oxysilane precursor material including, but not limited to tetraethoxy silane (TEOS). In another example, the monomeric precursor material may include or be fabricated of a siloxane precursor material such as, for instance, hexamethoxydisiloxane (HMODS). In yet another embodiment, the first additional insulator layer may include or be fabricated of an oligomeric precursor material, for instance, an oligo-azasilane precursor material having at least one of silicon-oxygen (Si—O) and/or silicon-nitrogen (Si—N) functional groups disposed therein. Note that, in one embodiment, the height of first additional insulator layer 108 being disposed partially within recess (es) 104 may be dependent upon the process parameters and the technology nodes being employed FIG. 1F illustrates the structure of FIG. 1E after bombarding first additional insulator layer 108 (FIG. 1E) with one or more species of gas-clusters to facilitate modifying at least one material property of the first insulator layer. The bombarding of the first additional layer may be accomplished utilizing, in part, a gas-cluster ion beam process described for bombarding insulator layer 106 with respect to FIG. 1D. As depicted and described above, the bombarding of the first additional insulator layer 108 (FIG. 1E) with gas-cluster(s) species results in forming a densified first additional insulator layer 108', as well as reducing a thickness of the densified first additional insulator layer. Note that, in one embodiment, the material of densified first additional insulator layer 108' may be similar or identical to the material of densified insulator layer 106' described above with respect to FIG. 1D. In one example, the densified first additional insulator layer 108' and densified insulator layer 106' may be or include a cross-linked oxide material such as, for instance, densified flowable oxide material. In another example, densified first additional insulator layer 108' and densified insulator layer 106' may be or include a cross-linked oxide material such as, for instance, densified high-aspect ratio (HARP) oxide material.

Figure 1G:
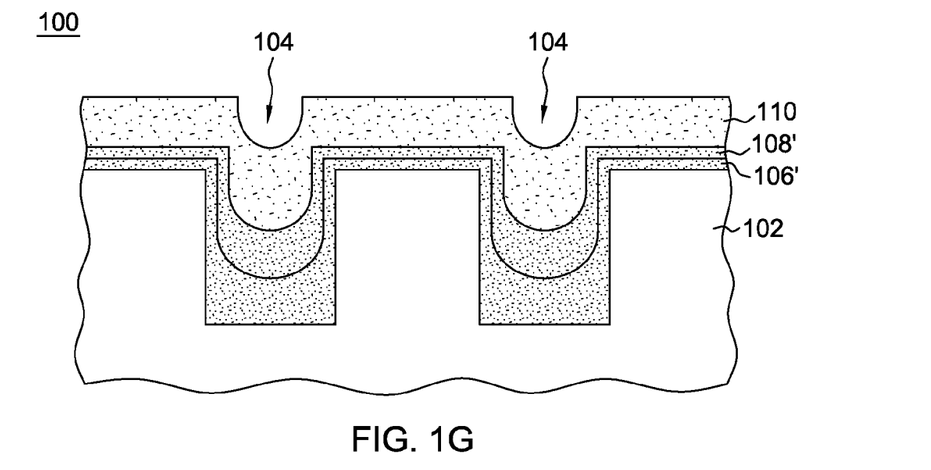
FIG. 1G depicts the structure of FIG. 1F with a second additional insulator layer having been disposed over the densified first additional insulator layer, in accordance with one or more aspects of the present invention.
Figure 1H:
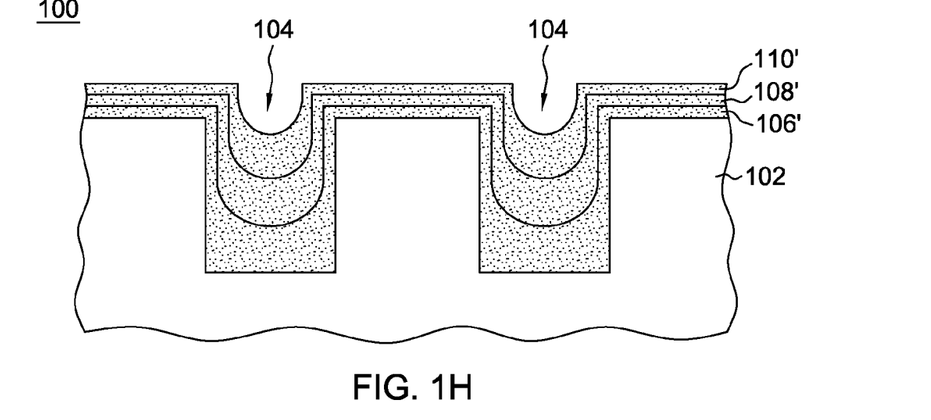
FIG. 1H depicts the structure of FIG. 1G after bombarding the second additional insulator layer with one or more species of gas-clusters to, for instance, obtain a densified second additional insulator layer, in accordance with one or more aspects of the present invention.

FIG. 1G illustrates the structure of FIG. 1F with a second additional insulator layer 110 disposed over densified first insulator layer 108'. The material of second additional insulator layer 110 may be similar or identical to the material of insulator layer 106 and first additional insulator layer 108 and may be formed using any of the deposition processes described for providing insulator layer 106, with respect to FIG. 1C. Briefly, the second additional insulator layer may include or be fabricated of a monomeric precursor material such as, for instance, oxysilane precursor material including, but not limited to tetraethoxy silane (TEOS). In another example, the monomeric precursor material may also include or be fabricated of a siloxane precursor material such as, for instance, hexamethoxydisiloxane (HMODS). In yet another embodiment, second additional insulator layer 110 may include or be fabricated of an oligomeric precursor material, for instance, an oligo-azasilane precursor material having at least one of silicon-oxygen (Si—O) and/or silicon-nitrogen (Si—N) functional groups disposed therein. Note that, in one embodiment, the height of the second additional insulator layer 110 being disposed partially within recess (es) 104 may be dependent upon the process parameters and the technology nodes being employed FIG. 1H illustrates the structure of FIG. 1G after bombarding second additional insulator layer 110 (FIG. 1G) with one or more species of gas-clusters to facilitate modifying at least one material property of the second additional insulator layer. The bombarding of the second additional layer may be accomplished utilizing, in part, a gas-cluster ion beam process described for bombarding insulator layer 106 with respect to FIG. 1D. As depicted and described above, the bombarding of the second additional insulator layer 110 (FIG. 1G) with gas-cluster(s) species results in forming a densified second additional insulator layer 110', as well as reducing a thickness of the densified second additional insulator layer. Note that, in one embodiment, the material of densified second additional insulator layer 110' may be similar or identical to the material of densified insulator layer 106' described above with respect to FIG. 1D and the material of densified second insulator layer 108' described above with respect to FIG. 1F. In one example, the densified second additional insulator layer 110' may be or include a cross-linked oxide material such as, for instance, densified flowable oxide material. In another example, densified second additional insulator layer 110' may be or include a cross-linked oxide material such as, for instance, densified high-aspect ratio (HARP) oxide material.

Continuing with FIG. 1H, although not depicted in figures, in one embodiment, the process steps depicted in FIGS. 1G-1H may be repeated sequentially in one or more iterations, for instance, as described above, to facilitate filling the recess with one or more densified additional insulator layers. In a specific example, the process steps may include, for instance, providing an additional insulator layer over the previously densified additional insulator layer and bombarding the additional insulator layer with gas-cluster(s) utilizing, in part, a gas-cluster ion beam (GCIB) process to modify at least one material property of the additional insulator layer. Note that, in one example, the number of cycles of the process steps to be performed so as to substantially fill the recess may be dependent upon parameters such as, for instance, width of the recess of the semiconductor structure and/or the material of the densified additional insulator layer to be employed. For instance, in the case of the densified additional insulator layer being a densified high-aspect ratio (HARP) oxide, fewer cycles of the process steps may be repeated, while greater number of cycles of the process steps may be required in the case of a densified flowable oxide material to substantially fill the recess.

Figure 1I:
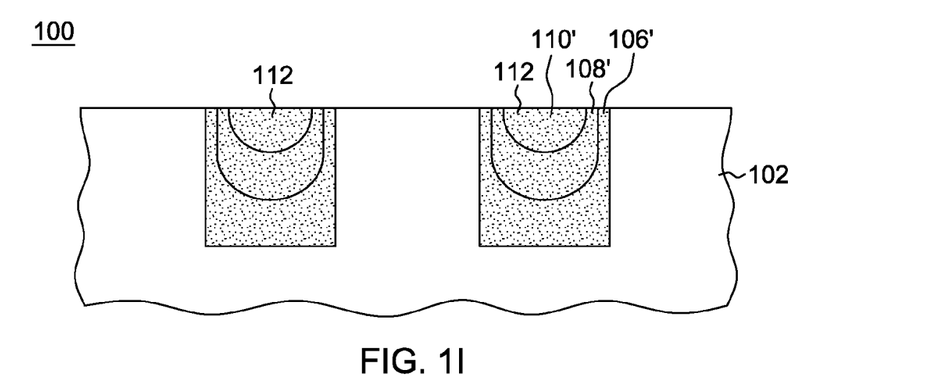
FIG. 1I depicts the structure of FIG. 1H after planarizing the densified insulator layer and one or more densified additional insulator layer(s) to define, at least in part, an isolation region of the semiconductor structure, in accordance with one or more aspects of the present invention.

As depicted in FIG. 1I, a non-selective chemical-mechanical polish or an etch-back polish may be performed to remove the excess densified insulator layer 106', densified first additional insulator layer 108' and densified second insulator layer 110', using (in one embodiment) the upper surfaces of substrate 102 as an etch stop, thereby defining, at least in part, isolation region(s) 112 of structure 100.

Figure 1J:
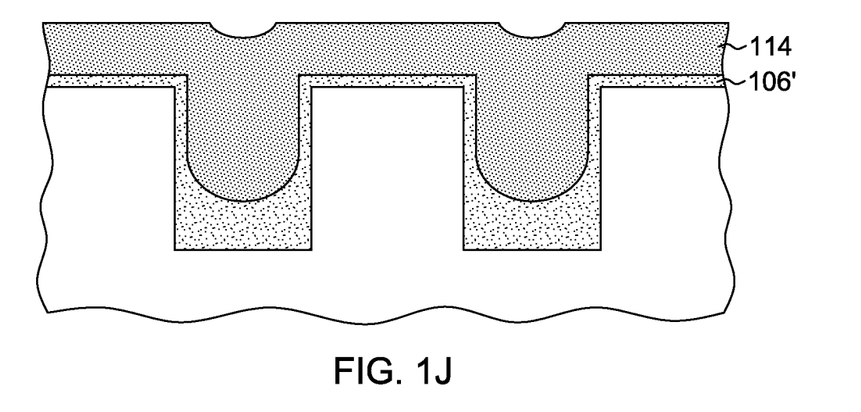
FIG. 1J depicts the structure of FIG. 1D with an additional insulator layer having been disposed over the densified insulator layer, in accordance with one or more aspects of the present invention.

FIG. 1J illustrates the structure of FIG. 1D with an additional insulator layer 114 having been disposed over densified insulator layer 106', in an alternate embodiment. The additional insulator layer 114 may include or be fabricated of an oxide material such as, for example, high-density plasma (HDP) oxide and may be deposited using a variety of techniques such as, for example, chemical vapor deposition (CVD), plasma-enhanced CVD, or sub-atmospheric pressure thermal CVD (SACVD) processes. The thickness of the additional insulator layer 114 may be (in one example) sufficient to allow for subsequent planarization of the structure. Note that, in this example, the high-density plasma (HDP) oxide material of the additional insulator material is sufficiently dense so as to facilitate an uniform deposition of the material within the recess, obviating a need for bombarding with the gas-cluster(s) species. Note also that, in this example, the densified insulator layer 106' employed may be, for instance, a densified flowable oxide material.

Figure 1K:
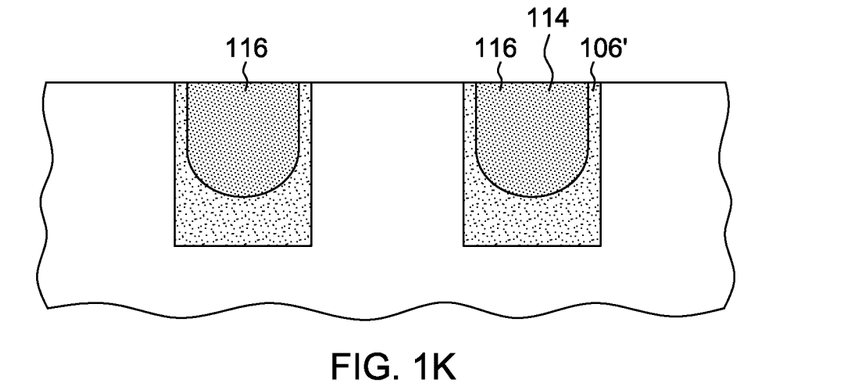
FIG. 1K depicts the structure of FIG. 1J after planarizing the densified insulator layer and the additional insulator layer to define, at least in part, an isolation region of the semiconductor structure, in accordance with one or more aspects of the present invention.

As depicted in FIG. 1K, a non-selective chemical-mechanical polish or an etch-back polish may be performed to remove the excess additional insulator layer 114, and densified insulator layer 106', using (in one embodiment) the upper surfaces of substrate 102 as an etch stop, thereby defining, at least in part, isolation region (s) 116 of structure 100.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
providing a semiconductor structure with a recess therein;
disposing an insulator layer conformally within the recess in the semiconductor structure to partially fill the recess;
forming at least one species of gas clusters by condensation of individual gas atoms or gas molecules during an expansion of high pressure gas into a vacuum;
modifying at least one material property of the insulator layer by bombarding the insulator layer with the at least one species of gas clusters to obtain a densified insulator layer within the recess, wherein bombarding the insulating layer includes controlling the gas clusters to provide localized high-energy impacts within an upper surface of the insulating layer which produce high annealing process temperatures that are no greater than 1200 degrees centigrade on a pico-second time scale to reduce a thickness of the densified insulator layer compared to that of the insulator layer by at least 10 percent; and
depositing at least one additional insulator layer within the recess over the densified insulator layer, wherein the densified insulator layer within the recess defines, at least in part, an isolation region of the semiconductor structure.

2. The method of claim 1, wherein the bombarding reduces a thickness of the densified insulator layer compared to that of the insulator layer by no more than 50 percent.

3. The method of claim 2, wherein the bombarding utilizes, in part, a gas-cluster ion beam process.

4. The method of claim 2, wherein the at least one species of gas clusters comprises at least one of argon (Ar), water ($H_2O$), argon and water ($Ar+H_2O$), carbon dioxide ($CO_2$), ozone ($O_3$) or carbon monoxide (CO) molecules.

5. The method of claim 1, wherein the disposing the insulator layer comprises providing a monomeric precursor material conformally within the recess, and wherein the modifying comprises bombarding the insulator layer to facilitate dissociating the monomeric precursor material to obtain the densified insulator layer and at least one by-product material, the bombarding removing the at least one by-product material from the densified insulator layer.

6. The method of claim 5, wherein the modifying comprises bombarding the insulator layer with ion beam energy to provide a localized high-energy interaction within an upper surface of the insulator layer, the high-energy interaction reducing the thickness of the insulator layer.

7. The method of claim 5, wherein the modifying comprises bombarding the insulator layer at an angle of incidence which is normal to the semiconductor structure to facilitate reducing thickness of the insulator layer in the direction of the angle of incidence.

8. The method of claim 5, wherein the insulator layer comprises a oxysilane precursor material, and wherein the densified insulator layer comprises a cross-linked oxide material obtained, at least in part, from modifying the insulator layer having the oxysilane precursor material.

9. The method of claim 1, wherein the disposing the insulator layer comprises providing an oligomeric precursor material, and wherein the modifying comprises bombarding the insulator layer to convert the oligomeric precursor material to an oligomeric oxide material, the bombarding dissociating the oligomeric oxide material to obtain the densified insulator layer and at least one by-product material.

10. The method of claim 9, wherein the bombarding the insulator layer facilitates removing the at least one by-product disposed therein.

11. The method of claim 9, wherein the modifying further comprises annealing the insulator layer to facilitate oxidizing, at least in part, the insulator layer to form an oligomeric oxide material and at least one by-product material, and wherein the bombarding preferentially removes the at least one by-product material.

12. The method of claim 9, wherein the insulator layer comprises an oligo-azasilane precursor material, and wherein the densified insulator layer comprises a cross-linked oxide material obtained, at least in part, from modifying the insulator layer having the oligo-azasilane precursor material.

13. The method of claim 1, wherein the modifying comprises bombarding the insulator layer with the at least one species of gas clusters to facilitate reducing a tensile stress thereof.

14. The method of claim 1, wherein the densified insulator layer comprises a first material layer, and the additional insulator layer comprises a second material layer, the first material layer and the second material layer being different material layers.

15. The method of claim 14, wherein the first material layer comprises a cross-linked oxide material, and the second material layer comprises a high-density plasma oxide material.

16. The method of claim 1, wherein the method comprises modifying at least one material property of the at least one additional insulator layer to obtain a densified at least one additional insulator layer, the densified at least one additional insulator layer being disposed over the densified insulator layer.

17. The method of claim 16, wherein the at least one additional insulator layer comprises a first additional insulator layer and a second additional insulator layer, and the method further comprises modifying at least one material property of the first additional insulator layer to obtain a densified first additional insulator layer, and wherein the method further comprises modifying at least one material property of the second additional insulator layer to obtain a densified second additional insulator layer, the densified second additional insulator layer being disposed over the densified first additional insulator layer.

18. The method of claim 17, wherein the densified insulator layer comprises a cross-linked oxide layer, and the first additional insulator layer comprises a first cross-linked oxide layer, and the densified second additional insulator layer comprises a second cross-linked oxide layer, and wherein the cross-linked oxide layer, the first cross-linked oxide layer and the second cross-linked oxide layer being same materials.

19. The method of claim 18, wherein the same materials comprise a densified flowable oxide material.

20. The method of claim 18, wherein the same materials comprise a densified high-aspect ratio oxide material.

21. The method of claim 1 wherein a pico-second time scale is less than a microsecond.

22. The method of claim 1 wherein the localized high-energy impacts are within a range of 2 to 20 nanometers of the upper surface of the insulating layer.

23. The method of claim 1 wherein the high annealing process temperatures are from 400 degrees centigrade to 1200 degrees centigrade.

\* \* \* \* \*